United States Patent [19]

Wetterling

[11] 4,121,120
[45] Oct. 17, 1978

[54] CLOCK DRIVEN VOLTAGE COMPARATOR EMPLOYING MASTER-SLAVE CONFIGURATION

[75] Inventor: Steven E. Wetterling, Portland, Oreg.

[73] Assignee: Tektronix, Inc., Beaverton, Oreg.

[21] Appl. No.: 793,980

[22] Filed: May 5, 1977

[51] Int. Cl.² .............................................. G11C 7/06
[52] U.S. Cl. .................................. 307/352; 307/208; 307/247 R
[58] Field of Search ............... 307/352, 354, 362, 208, 307/247 R

[56] References Cited

U.S. PATENT DOCUMENTS

| | | | |
|---|---|---|---|
| 3,054,910 | 9/1962 | Bothwell | 307/362 |
| 3,727,079 | 4/1973 | Garrett | 307/354 |
| 3,728,560 | 4/1973 | Treadway | 307/362 |
| 3,750,036 | 7/1973 | Burrows et al. | 307/352 X |

*Primary Examiner*—John S. Heyman
*Attorney, Agent, or Firm*—George T. Noe

[57] ABSTRACT

A pair of clock driven voltage comparators are arranged in a master-slave configuration so that voltage comparisons are made only on a clock edge and the output is held valid over the entire clock period. Each comparator stage includes a latch to lock the comparator output in the logical state it was in when the latch was enabled.

11 Claims, 3 Drawing Figures

CLOCK DRIVEN VOLTAGE COMPARATOR EMPLOYING MASTER-SLAVE CONFIGURATION

BACKGROUND OF THE INVENTION

Clock driven or strobed comparators are well known in the art, and one improved version thereof is shown and described in U.S. patent application Ser. No. 657,414 filed Feb. 12, 1976 now abandoned. In such single-stage comparators, the circuit must perform both the functions of being an amplifer and being a latch. To achieve the desired results, the strobe signal is a symmetrical square-wave clock signal having a 0.5 duty cycle so that the comparator alternates between both functions, each being active 50 percent of the time. The results of the comparison decision are valid and available at the comparator outputs only during the latch portion of the clock period. At increased clock rates where the clock period becomes very small, the output data valid period becomes even smaller, to point where it is unusable in permitting transmission of the data to other circuits.

SUMMARY OF THE INVENTION

The present invention relates to voltage comparators, and in particular to master-slave arrangements of strobed or clock-driven comparators.

A master comparator and a slave comparator are connected in tandem so that the outputs from the master comparator are coupled to the inputs of the slave comparator. The operating circuitry is arranged so that the master comparator and slave latch are enabled together, and the master latch and slave comparator are enabled together. Thus when the clock input is low, the master stage performs as a differential amplifier while the slave stage is latched into the prior decision state of the master. When the clock signal makes its low-to-high transition, the master stage latches into a decision state determined by the differential input voltage to the master stage just prior to the clock transition. While the clock input is high, the slave stage performs as an amplifier, transmitting the decision state of the master stage to the system outputs. When the clock signal returns to its low state, the slave stage latches the system output in the current decision state until the next clock low-to-high transition. Thus the decision state is held as a valid data output for an entire clock period, permitting subsequent transmission and processing circuits time to utilize the data.

It is therefore one object of the present invention to provide a clock-driven voltage comparator employing a master-slave configuration.

It is another object to provide a clock-driven comparator in which output data is valid over an entire clock period.

It is a further object to provide a high performance clock-driven comparator system compatible with lower performance transmission and processing circuits.

Other objects and attainments of the present invention will become apparent to those skilled in the art upon a reading of the following detailed description when taken in conjunction with the drawings.

DETAILED DESCRIPTION OF THE INVENTION

Figure 1:
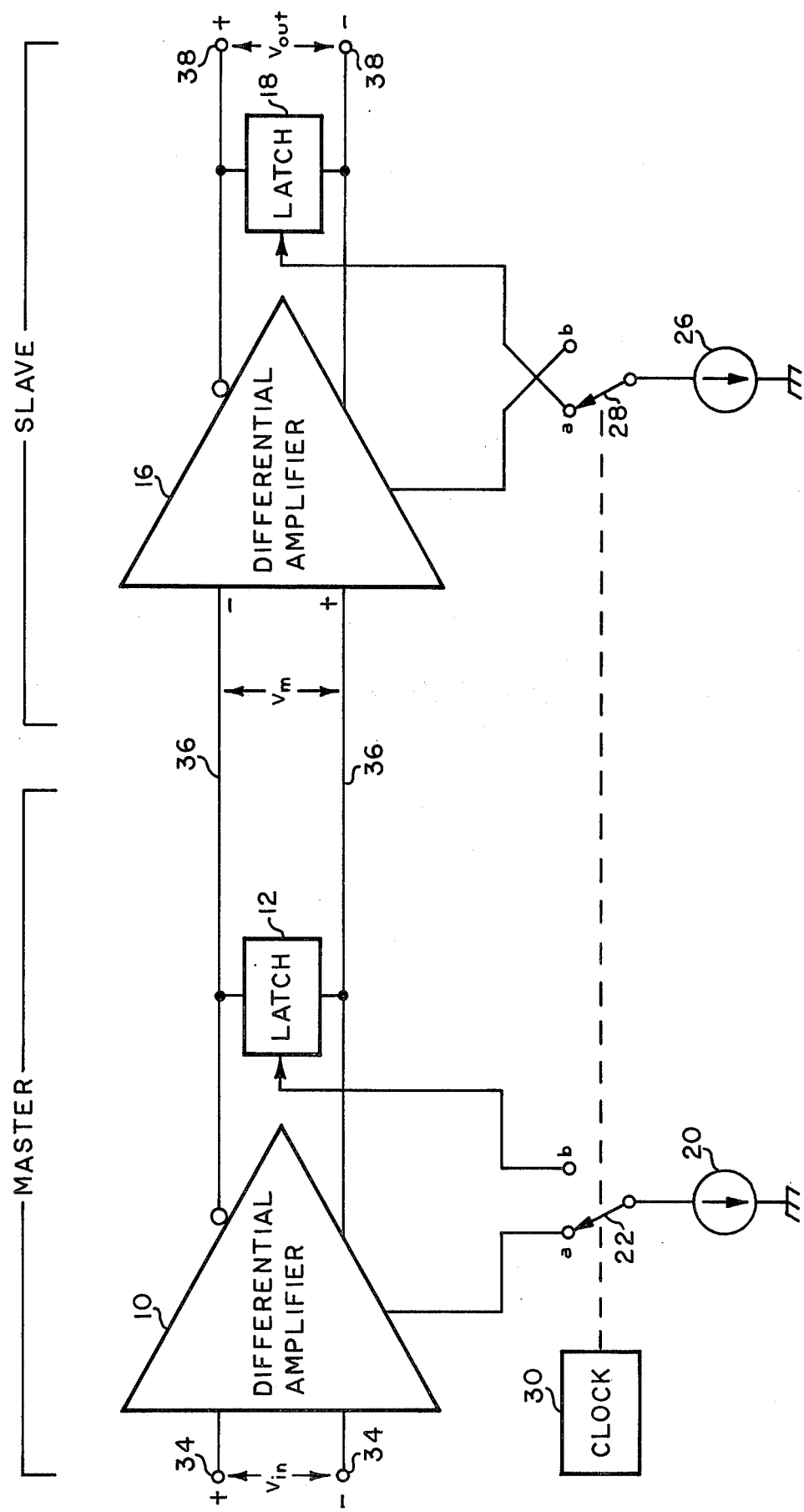
FIG. 1 shows an overall block diagram of a master-slave clock-driven comparator system in accordance with the present invention.

Referring to FIG. 1, an overall block diagram of a master-slave clock-driven comparator system is shown. A master stage comprising a differential amplifier 10 and a latch 12 and a slave stage comprising a differential amplifier 16 and a latch 18 are connected in tandem whereby the complementary output from differential amplifier 10 is applied to the input of differential amplifier 16. A first constant current source 20 is provided for the master stage, and the constant current is applied through a switch 22 to either the differential amplifier 10 or latch 12 for operation thereby, as will be discussed later. Similarly, a second constant current source 26 is provided for the slave stage, and the constant current is applied through a switch 28 to either the differential amplifier 16 or the latch 18 for operation thereby. A clock 30 is operatively coupled to switches 22 and 28 to simultaneously place both switches in the $a$ position and then in the $b$ repetitiously at a predetermined rate. In actual practice, switches 22 and 28 may suitably be emitter-coupled transistor pairs which are switched by a repetitive clock signal to route the constant current alternately through collectors $a$ and $b$.

Figure 2:
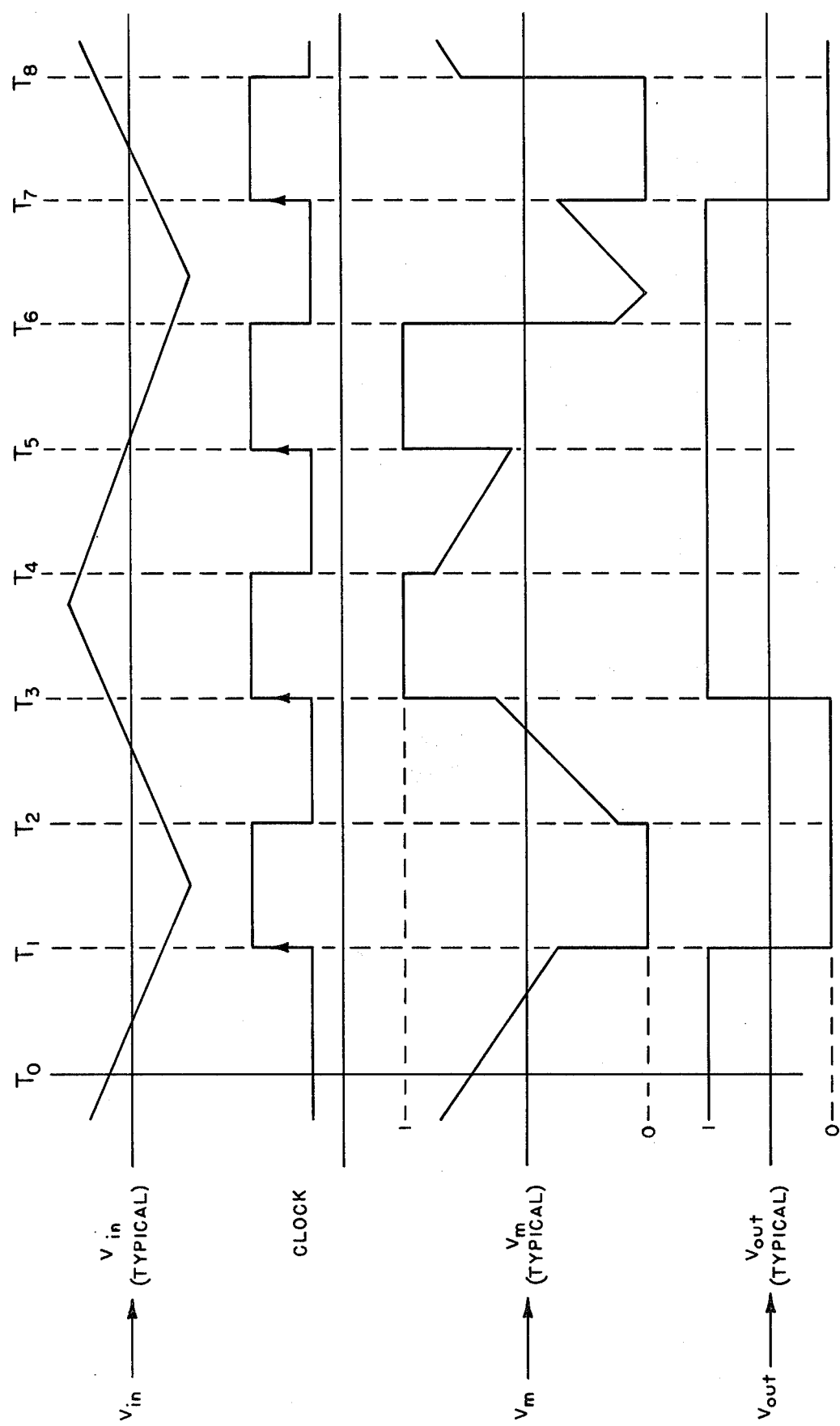
FIG. 2 is a ladder diagram showing the timing and condition relationships of waveforms present in the system of FIG. 1.

Referring to the waveforms of FIG. 2, the system of FIG. 1 operates as follows. An analog input signal $V_{in}$ is applied via the differential input terminals 34 to the inputs of differential amplifier 10. For this description, $V_{in}$ is shown as a triangular waveform; however, it is understood that any analog signal may be applied. At time $T_o$, switches 22 and 28 are in the $a$ position, and $V_{in}$ is negative-going, but is positive with respect to the decision level. Differential amplifier 10 is active, and thus $V_m$ is an amplified version of $V_{in}$. Since the waveforms of FIG. 2 are logic oriented rather than voltage oriented, the waveshape $V_m$ is shown in phase with $V_{in}$; however, those skilled in the art realize that in terms of voltage, $V_m$ would in inverted with respect to $V_{in}$. Thus $V_m$ is in a transitory state, moving from a logical 1 toward a logical 0 at $T_o$, but is above the decision level. At this juncture, differential amplifier 16 is in a disabled state, and latch 18 is in an enabled state by the current through switch 28. Therefore, at $T_o$ the output signal $V_{out}$ is latched in a logical 1 state, which correctly corresponds to the previous condition of $V_{in}$.

At time $T_1$, the CLOCK signal changes state, setting switches 22 and 28 in the $b$ position, thereby disabling differential amplifier 10 and latch 18, and enabling latch 12 and differential amplifier 16. Prior to $T_1$, signal $V_{in}$ had crossed the decision level, and therefore the output $V_m$ of differential amplifier 10 is latched at logical 0 at $T_1$. $V_{out}$ switches from a logical 1 to a logical 0 since differential amplifier 16 is now active, amplifying $V_m$.

At time $T_2$, the clock signal reverts, causing switches 22 and 28 to move to the $a$ position. Latch 18 turns on, latching $V_{out}$ at the logical 0 state while differential amplifier 10 samples new data. Note that as a result of the master-slave action hereinabove described, $V_{out}$ remains in the logical 0 state for the entire period between $T_1$ and $T_3$, or for one complete clock cycle.

The action hereinabove described repeats, and it can be discerned that since the values of $V_{in}$ sampled at times $T_3$ and $T_5$ are above the decision level, the output data $V_{out}$ is a logical 1 for the complete clock cycles $T_3$-$T_5$ and $T_5$-$T_7$. At time $T_7$, the value of $V_{in}$ sampled is below the decision level, resulting in logical 0 output data $V_{out}$ for cycle $T_7$-$T_9$.

Figure 3:
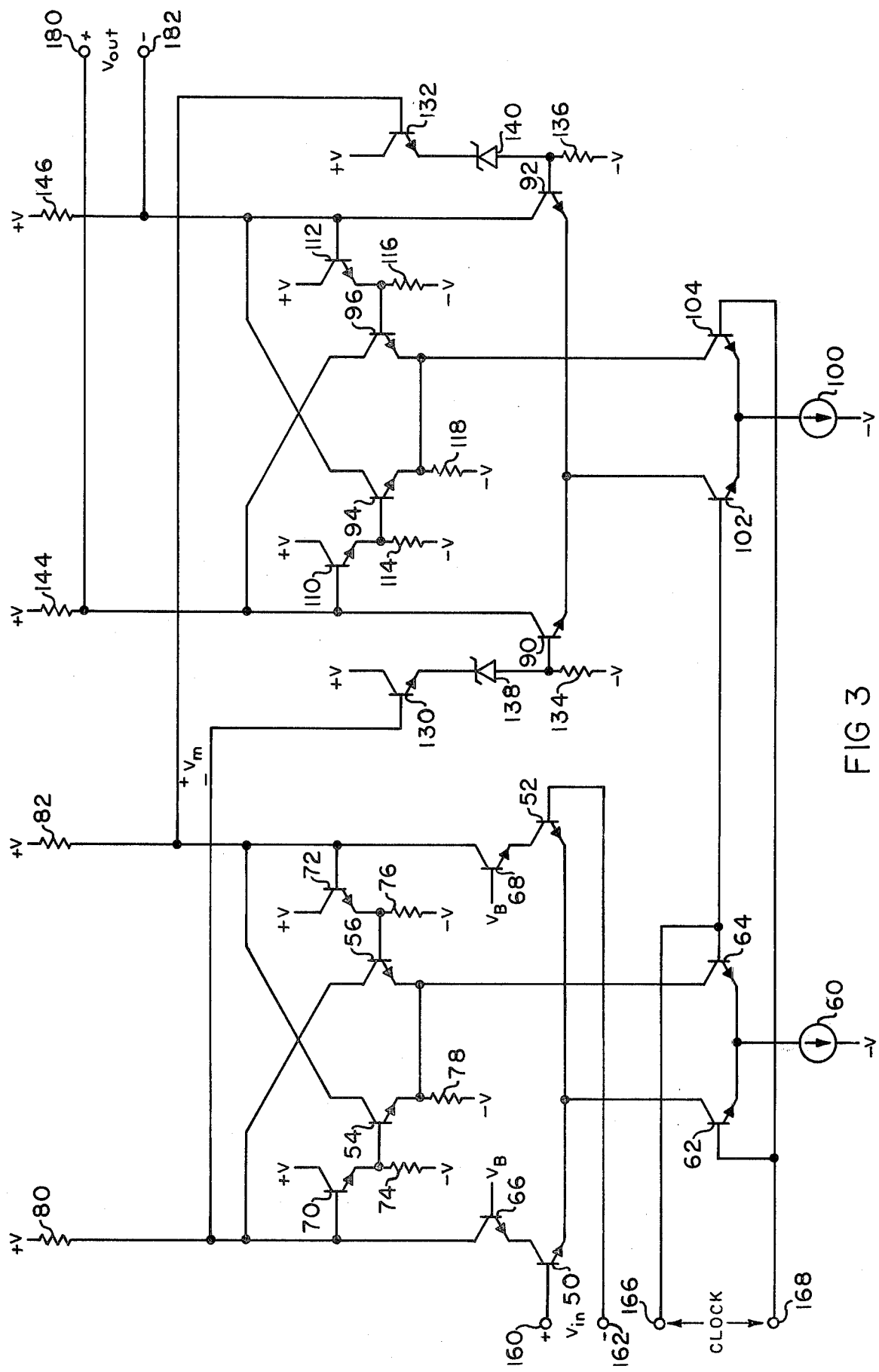
FIG. 3 shows a detailed schematic of a clock-driven comparator system employing a master-slave configuration.

A detailed schematic of a clock-driven voltage comparator system employing a master-slave configuration is shown in FIG. 3. Each stage includes a strobed comparator of the type disclosed in U.S. patent application Ser. No. 657,414, filed Feb. 12, 1976 now abandoned.

The master stage consists of emitter-coupled input transistors 50 and 52, and cross-coupled latching transistors 54 and 56. Most of the operating current for these transistor pairs is furnished by constant-current sink 60 and routed via a current switch comprising transistors 62 and 64. Common-base amplifier transistors 66 and 68 are connected in cascode with transistors 50 and 52 respectively to isolate the input stage from voltage transients developed in the latch. Emitter followers including transistors 70 and 72 and resistors 74 and 76 are coupled between the collectors of transistors 66 and 68 and the bases of latching transistors 54 and 56 respectively. The latching transistors 54 and 56 are pre-biased to the turn-on threshold by a slight amount of current provided by resistor 78. Such prebiasing of the latch ensures fast switching speed. The collectors of transistors 66 and 56 are connected through a load resistor 80 to a source of voltage +V, and similarly, the collectors of transistors 68 and 54 are connected through a load resistor 82 to a source of voltage +V. The master stage outputs are taken from these collectors.

The slave stage consists of emitter-coupled input transistors 90 and 92, and cross-coupled latching transistors 94 and 96. A constant current sink 100 furnishes most of the available operating current for the input and latch transistor pairs, and such operating current is routed via a current switch comprising transistors 102 and 104. Emitter followers including transistors 110 and 112 and resistors 114 and 116 are coupled between the collectors of transistors 90 and 92 and the bases of latching transistors 94 and 96 respectively. A resistor 118 provides a slight amount of pre-biasing current to keep the latch transistor pair 94-96 near the turn-on threshold. The input voltage $V_m$ from the master stage is applied to transistors 90 and 92 via emitter followers consisting of transistors 130 and 132 respectively, and their associated emitter resistors 134 and 136. Zener diodes 138 and 140 are included to provide a voltage level shift so that the operating points of the slave stage are substantially the same as the master stage. The collectors of transistors 90 and 96 are connected through a load resistor 144 to a source of voltage +V, and similarly, the collectors of transistors 92 and 94 are connected through a load resistor 146 to a source of voltage +V.

Now referring to the overall master-slave clock-driven comparator system in connection with the waveforms of FIG. 2, the analog input signal $V_{in}$ is applied to input terminals 160 and 162, and complementary clock signals are applied to terminals 166 and 168. The output data $V_{out}$ is taken from output terminals 180 and 182. At time $T_0$, current switching transistors 62 and 104 are conducting while transistors 64 and 102 are off, so that the current supply is directed to the master stage differential amplifier transistors 50 and 52 and the slave stage latch transistors 94 and 96. At time $T_1$, transistors 62 and 104 are switched off while transistors 64 and 102 are switched on, directing the operating current to the master stage latch and the slave stage differential amplifier. At time $T_2$, the current switching transistors are switched again, and the sequence repeats. The operation is the same as described above in connection with FIG. 1. Thus the master and slave stages are strobed in alternating fashion whereby the master stage first samples the input signal while the slave stage is latched into the prior decision state of the master. Then the master stage latches into a decision state determined by the sampled differential input voltage while the slave stage transmits the new decision data to the output terminals 180 and 182. Again the master stage samples the input while the slave stage is latched into the prior decision state of the master. From the foregoing description, it can be discerned that the data at output terminals 180 and 182 is held through a complete clock period, permitting low-speed transmission of the data to subsequent circuits.

It will, therefore, be appreciated that the aforementioned and other desirable objects have been achieved; however, it should be noted that the particular embodiment of the invention, which is shown and described herein, is intended as merely illustrative and not as restrictive of the invention.

I claim:

1. A clock-driven voltage comparator, comprising:
   comparator means for receiving an input signal and periodically determining therefrom logic states, said comparator means comprising a first emitter-coupled pair of transistors the bases of which are adapted to receive said input signal;
   amplifier means couped to said comparator means for amplifying said logic states, said amplifier means comprising a second emitter-coupled pair of transisors the bases of which are coupled to the collectors of said first pair of transistors; and
   first and second latch means operatively coupled to said comparator means and said amplifier means respectively for holding said logic states until new logic states are determined, said first latch means comprising a third emitter-coupled pair of transistors the collectors of which are cross coupled to the collectors of said first pair of transistors, and said second latch means comprises a fourth emitter-coupled pair of transistors the collectors of which are cross coupled to the collectors of said second pair of transistors.

2. A comparator in accordance with claim 1 further including means for operating said comparator means, said amplifier means, and said latch means in a predetermined sequence.

3. A comparator in accordance with claim 2 wherein said operating means includes current generator means, switch means, and a source of clock signals, said switch means being operated by said clock signals for providing operating current to said comparator.

4. A comparator in accordance with claim 3 wherein said switch means comprises a plurality of transistors which are selectively operated by said clock signals.

5. A comparator in accordance with claim 3 wherein said operating means alternately enables first said comparator means and said second latch means, and then said amplifier means and said first latch means.

6. A comparator in accordance with claim 1 wherein the emitters of said first, second, third, and fourth pairs of transistors are selectively connected through said switch means to said current generator means for operation thereby.

7. A comparator in accordance with claim 6 wherein said switch means comprises two emitter-coupled pairs of transistors whose respective collectors are connected to said first, second, third, and fourth pairs of transistors so that said first and third pairs of transistors are operated simultaneously while said second and fourth pairs of transistors are turned off, and then said first and third pairs of transistors are turned off while said second and fourth pairs of transistors are operated simultaneously.

8. A clock-driven comparator system, comprising:
a first differential amplifier and a second differential amplifier arranged in a master-slave configuration wherein the output of said first differential amplifier is coupled to the input of said second differential amplifier;
latch means associated with each said first and second differential amplifiers; and
operating means coupled to said first and second differential amplifiers and said latch means for cyclically operating said system by alternately enabling said first and second differential amplifiers, said latch means being enabled when said associated first and second differential amplifiers are disabled.

9. A system in accordance with claim 8 wherein said latch means comprises first and second latches coupled respectively to the outputs of said first and second differential amplifiers.

10. A system in accordance with claim 8 wherein said operating means includes a source of clock signals, current generator means for producing operating current, and switch means responsive to said clock signals for selectively routing said operating current to said first and second differential amplifiers and said latch means.

11. A system in accordance with claim 10 wherein said switch means comprises a plurality of transistors selectively activated by said clock signals.

* * * * *

Disclaimer 4,121,120.—*Steven E. Wetterling*, Portland, Oreg. CLOCK DRIVEN VOLTAGE COMPARATOR EMPLOYING MASTER-SLAVE CONFIGURATION. Patent dated Oct. 17, 1978. Disclaimer filed Apr. 28, 1980, by the assignee, *Tektronix, Inc.*

Hereby enters this disclaimer to all claims of said patent.

[*Official Gazette June 24, 1980.*]